(12) United States Patent
Dejima

(10) Patent No.: US 7,078,923 B2
(45) Date of Patent: Jul. 18, 2006

(54) ENVIRONMENTAL TEST METHOD AND SYSTEM

(75) Inventor: Ryouji Dejima, Okazaki (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/854,795

(22) Filed: May 27, 2004

(65) Prior Publication Data

US 2004/0246013 A1    Dec. 9, 2004

(30) Foreign Application Priority Data

May 30, 2003   (JP)   ............................. 2003-155455

(51) Int. Cl.
*G01R 31/02*   (2006.01)
(52) U.S. Cl. .................................. 324/760
(58) Field of Classification Search ........ 324/750–765; 165/80.3
See application file for complete search history.

(56) References Cited

U.S. PATENT DOCUMENTS

| | | | | |
|---|---|---|---|---|
| 1,330,920 A | * | 2/1920 | Stacey, Jr. ................... | 165/229 |
| 5,451,884 A | * | 9/1995 | Sauerland ..................... | 324/760 |
| 5,584,971 A | * | 12/1996 | Komino ................. | 204/192.13 |
| 6,249,132 B1 | * | 6/2001 | Amemiya .................... | 324/760 |
| 6,313,654 B1 | * | 11/2001 | Nansai et al. ................ | 324/760 |
| 6,329,831 B1 | * | 12/2001 | Bui et al. .................... | 324/765 |
| 6,711,961 B1 | * | 3/2004 | Theriault et al. .......... | 73/865.6 |
| 6,762,616 B1 | * | 7/2004 | Kawaguchi et al. ........ | 324/765 |
| 2002/0050834 A1 | * | 5/2002 | Olsen et al. ................. | 324/760 |
| 2002/0135389 A1 | * | 9/2002 | Melgaard et al. ........... | 324/760 |

FOREIGN PATENT DOCUMENTS

| | | |
|---|---|---|
| JP | 5-52904 | 3/1993 |
| JP | 2001-281294 | 10/2001 |
| JP | 2002-286811 * | 3/2002 |
| JP | 2002-286811 | 10/2002 |

* cited by examiner

*Primary Examiner*—Paresh Patel
(74) *Attorney, Agent, or Firm*—Posz Law Group, PLC

(57) ABSTRACT

In an environmental test system for controlling a temperature environment of a member to be tested at least from a low temperature environment to a high temperature environment, an air supplying unit supplies low dew point air to an inside of the test chamber. The low dew point air has a dew point temperature lower than a predetermined cooling temperature. The predetermined cooling temperature is defined by the low temperature environment. A temperature changing unit is operative to change a temperature of the low dew point air supplied from the air supplying unit to the inside of the test chamber to control the temperature environment from the low temperature environment to the high temperature environment.

5 Claims, 9 Drawing Sheets

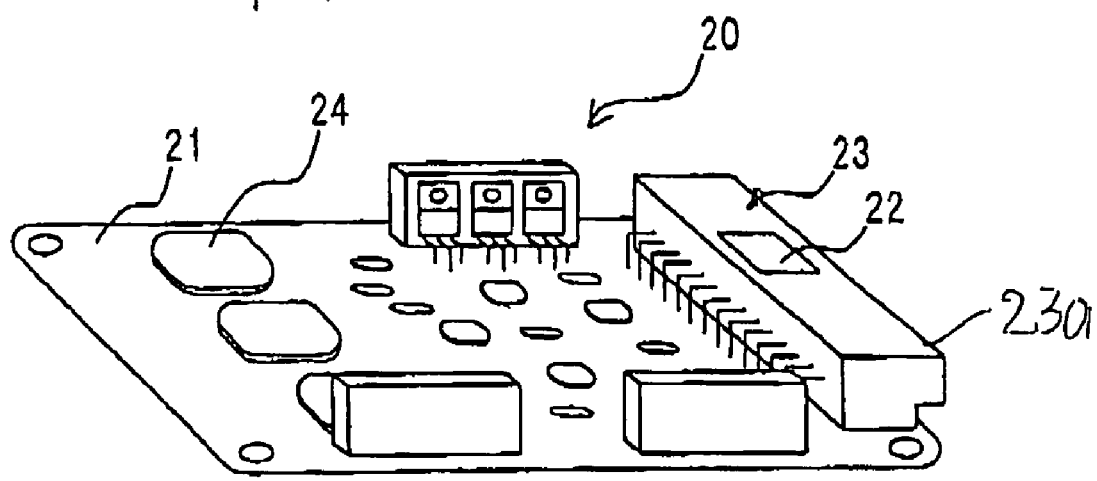

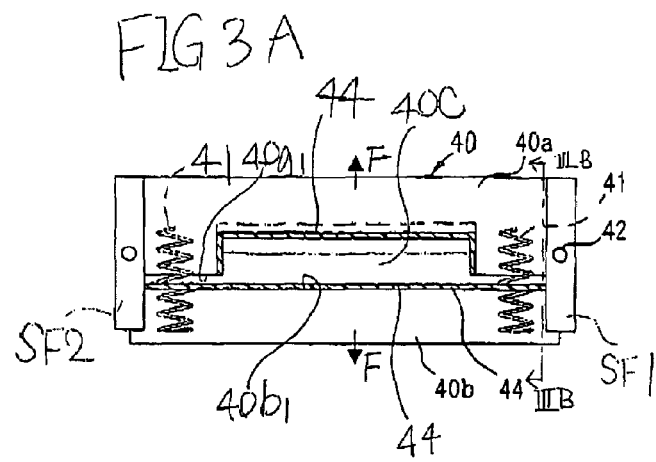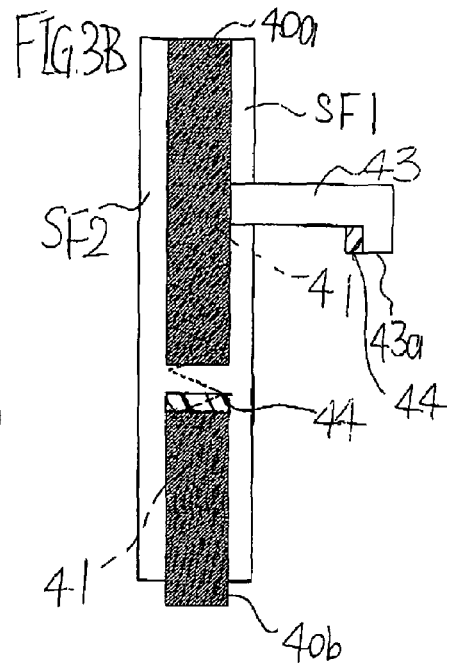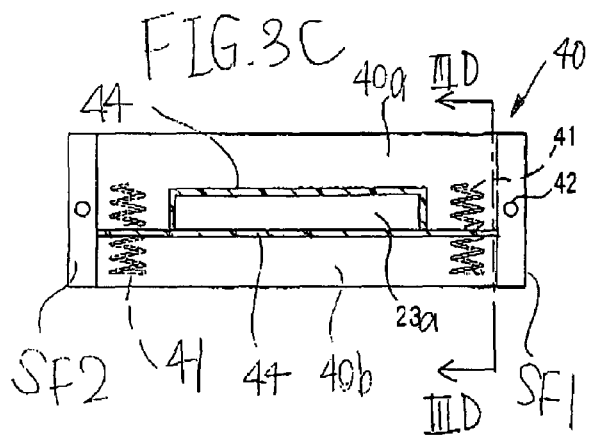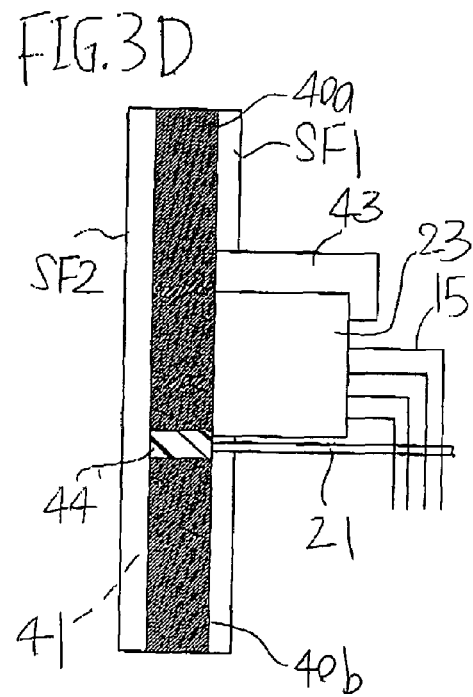

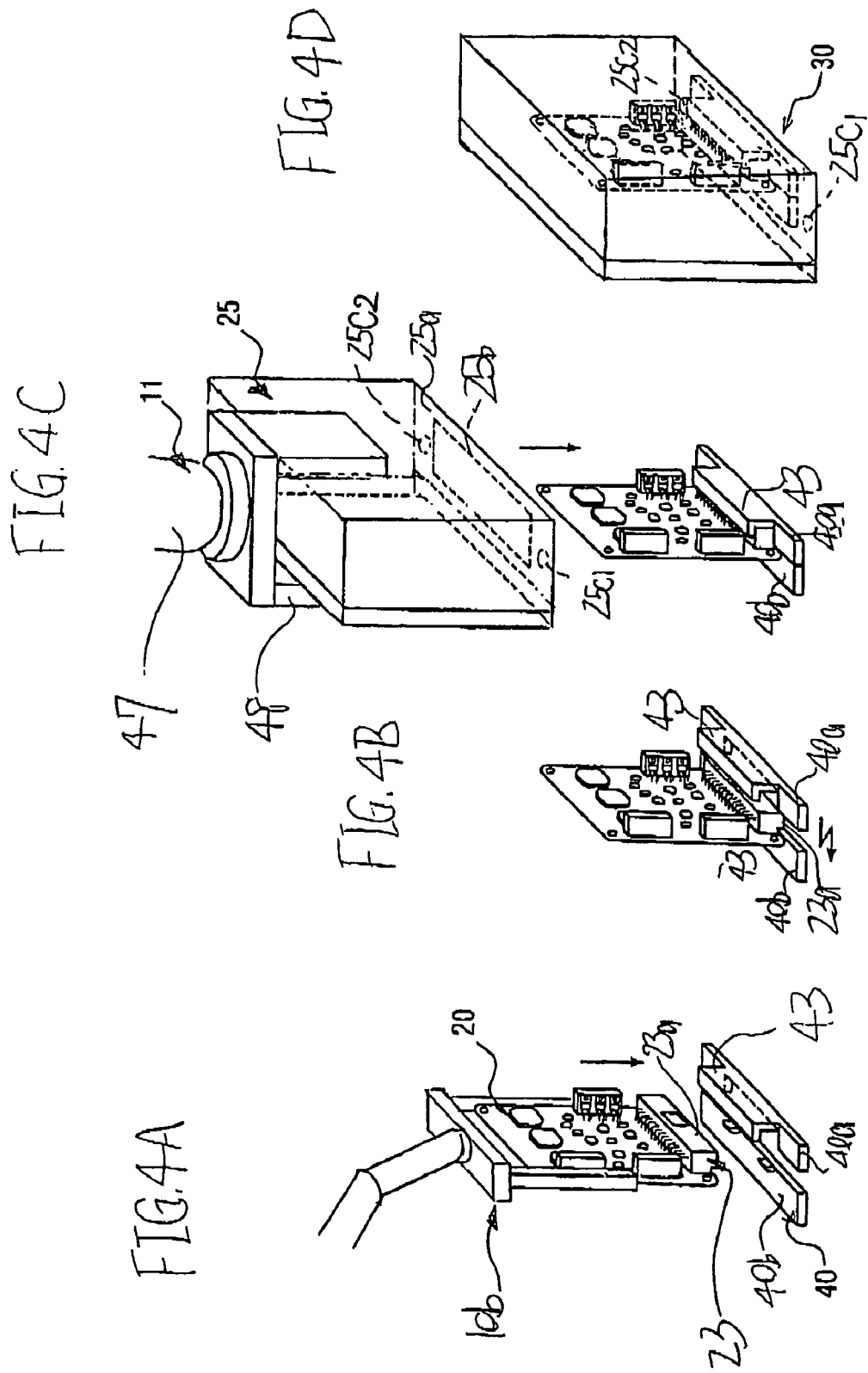

ENVIRONMENTAL TEST METHOD AND SYSTEM

BACKGROUND OF THE INVENTION

The present invention relates to an environmental test method and system.

A conventional environmental test system is used to apply a voltage on a member to be tested while adjusting the internal temperature in the test chamber in which the member is installed. An example of these types of conventional environmental test systems is disclosed in Japanese Unexamined Patent Publication 2002-286811.

FIG. 8 is a partially cross sectional view of a part of the environmental test system according to the publication. This publication shows the environmental test systems that individually carry out a plurality of optical communication modules to be tested.

In FIG. 8, the environmental test system is provided with an individual test module 99, a test chamber 100 contained in the individual test module 99, and a test board 160 mounted on a bottom wall of the test chamber 100. A member 150 to be tested is set on the test board 160.

The environmental test system has a power supply cable 170 and an optical fiber 180 which are connected between the member 150 and a test unit (not shown) located on the outside of the test module 99, respectively.

The environmental test system is provided with a heating device 110 and a cooling device 120 which are contained in the test module 99. The heating device 110 and the cooling device 120 are capable of controlling the temperature of air existing in the test module 99, and a fan 130 for moving the temperature-controlled air toward one end portion of one wall of the test chamber 100.

At least one slit is formed at the one end portion of the one wall of the test chamber 100. A plurality of wind direction control plates 190 are attached to the inner surface of the one end portion of the chamber's one wall. The wind-direction control plates 190 are directed, for example, toward the member 150.

The test module 99 is provided with a door 140 openable and closable at the other wall of the test chamber 100. The environmental test system is further equipped with a temperature sensing unit 200 for sensing the internal temperature in the test chamber 100.

Opening and closing of the door 140 allows the member 150 to be carried in and out of the test chamber 100. That is, the test board 160 on which the member 150 is mounted is inserted through the opening and closing of the door 140 into the test chamber 100. After the installation of the member 150, the test module 99 and the test chamber 100 are hermetically closed.

The heating device 110 and the cooling device 120 heat and cool the air existing in the test module 99 to control the temperature of it, and the temperature-controlled air enters the test chamber 100 through the slit to be directed by the wind-direction control plates 190. The controlled air determines the internal temperature in the test chamber 100 to predetermined temperatures, such as a first temperature requirement of 25 degrees, a second requirement of minus 40 degrees, and a third temperature requirement of 85 degrees.

A power supply unit in the test unit starts to supply power through the power supply cable 170 to the member 150. When the internal temperature reaches one of the predetermined temperatures, the environmental test, such as an optical signal communication test, is carried out according to the predetermined test items for the environmental test.

In this disclosed environmental test system, however, the opening and closing of the door 140 in inserting the member 150 into the inside of test chamber 100 causes air outside of the test module 99 to enter the inside of test chamber 100. This entered air causes dew on the surface of the member 150 in the process of controlling the internal temperature of the test chamber 100 from low temperature to high temperature.

SUMMARY OF THE INVENTION

The present invention is made on the background to prevent dew from being formed on the surface of a member to be tested, which is installed in a test chamber.

According to one aspect of the present invention, there is provided an environmental test system for controlling a temperature environment of a member to be tested at least from a low temperature environment to a high temperature environment. The high temperature environment is higher in temperature than the low temperature environment. In the system, a test chamber unit has a wall portion for defining a test chamber that contains the member to be tested. The wall portion is made of heat insulating material, and the temperature environment surrounds the member to be tested in the test chamber. An air supplying unit supplies low dew point air to an inside of the test chamber. The low dew point air has a dew point temperature lower than a predetermined temperature. The predetermined temperature is defined by the low temperature environment. A temperature changing unit is operative to change a temperature of the low dew point air supplied from the air supplying unit to the inside of the test chamber to control the temperature environment from the low temperature environment to the high temperature environment.

In the one aspect of the invention, because the low dew point air, which has the dew point temperature lower than the predetermined cooling temperature defined by the low temperature environment, is supplied to the inside of the test chamber, even if the temperature environment changes within the range from the low temperature environment and the high temperature environment, it is possible to prevent dewdrops from occurring on the member to be tested.

According to another aspect of the present invention, there is provided an environmental test system for controlling a temperature environment of a member to be tested at least from a low temperature environment to a high temperature environment. The high temperature environment is higher in temperature than the low temperature environment. In the system, a test chamber assembly includes a supporting member that supports the member to be tested, and a heat insulated housing having an opening. The test chamber assembly is assembled so that, when the member to be tested is contained in an inside of the housing, the supporting member is closely fitted in the opening of the housing. The temperature environment surrounds the member to be tested in the inside of the housing. An air supplying unit supplies low dew point air to the inside of the housing. The low dew point air has a dew point temperature lower than a predetermined temperature. The predetermined temperature is defined by the low temperature environment.

According to a further aspect of the present invention, there is provided an environmental test method of controlling a temperature environment of a member to be tested at least from a low temperature environment to a high temperature environment. The high temperature environment is higher in temperature than the low temperature environment. In the method, a test chamber unit having a wall portion for defining a test chamber is prepared. The wall portion is made of heat insulating material. The member to be tested is contained in the test chamber. The temperature environment surrounds the member to be tested in the test chamber. Low dew point air is supplied to an inside of the test chamber. The low dew point air having a dew point temperature is lower than a predetermined temperature. The predetermined temperature is defined by the low temperature environment. The low dew point air supplied from the supplying step is heated at a predetermined temperature so that the heated low dew point air is supplied to the inside of the test chamber.

According to a still further aspect of the present invention, there is provided an environmental test method of controlling a temperature environment of a member to be tested at least from a low temperature environment to a high temperature environment. The high temperature environment is higher in temperature than the low temperature environment. In this method, a supporting member that supports the member to be tested is prepared, and a heat insulated housing having an opening is also prepared.

The member to be tested is inserted through the opening into the housing so that the supporting member is closely fitted in the opening of the housing, thereby producing an assembly that is integrated with the housing, the member to be tested, and the supporting member. The temperature environment surrounds the member to be tested in the inside of the housing. Low dew point air is supplied to the inside of the housing. The low dew point air has a dew point temperature lower than a predetermined cooling temperature, and the predetermined cooling temperature is defined by the low temperature environment.

BRIEF DESCRIPTION OF THE DRAWINGS

Other objects and aspects of the invention will become apparent from the following description of embodiments with reference to the accompanying drawings in which:

FIG. 2 is a perspective view schematically illustrating a circuit board to be tested according to the embodiment of the present invention;

FIG. 3A is a schematic plan view illustrating a connector chuck in a state prior to the hold of the circuit board according to the embodiment of the present invention;

FIG. 3B is an enlarged schematic cross sectional view taken on line IIIB—IIIB shown in FIG. 3A;

FIG. 3C is a schematic plan view illustrating the connector chuck in a state after the hold of the circuit board according to the embodiment of the invention;

FIG. 3D is an enlarged schematic cross sectional view taken on line IIID—IIID shown in FIG. 3C;

FIG. 4A is a schematic perspective view illustrating a process of mounting the circuit board on the connector chuck according to the embodiment of the invention;

FIG. 4B is a schematic perspective view illustrating a process of fixedly supporting the circuit board by the connector chuck according to the embodiment of the invention;

FIG. 4C is a schematic perspective view illustrating a process of putting a test chamber housing over the connector chuck to which the circuit board is fixedly supported according to the embodiment of the invention;

FIG. 4D is a schematic perspective view illustrating an assembly and the circuit board contained therein;

DETAILED DESCRIPTION OF EMBODIMENTS OF THE INVENTION

An embodiment of the invention will be described hereinafter with reference to the accompanying drawings.

Figure 1:
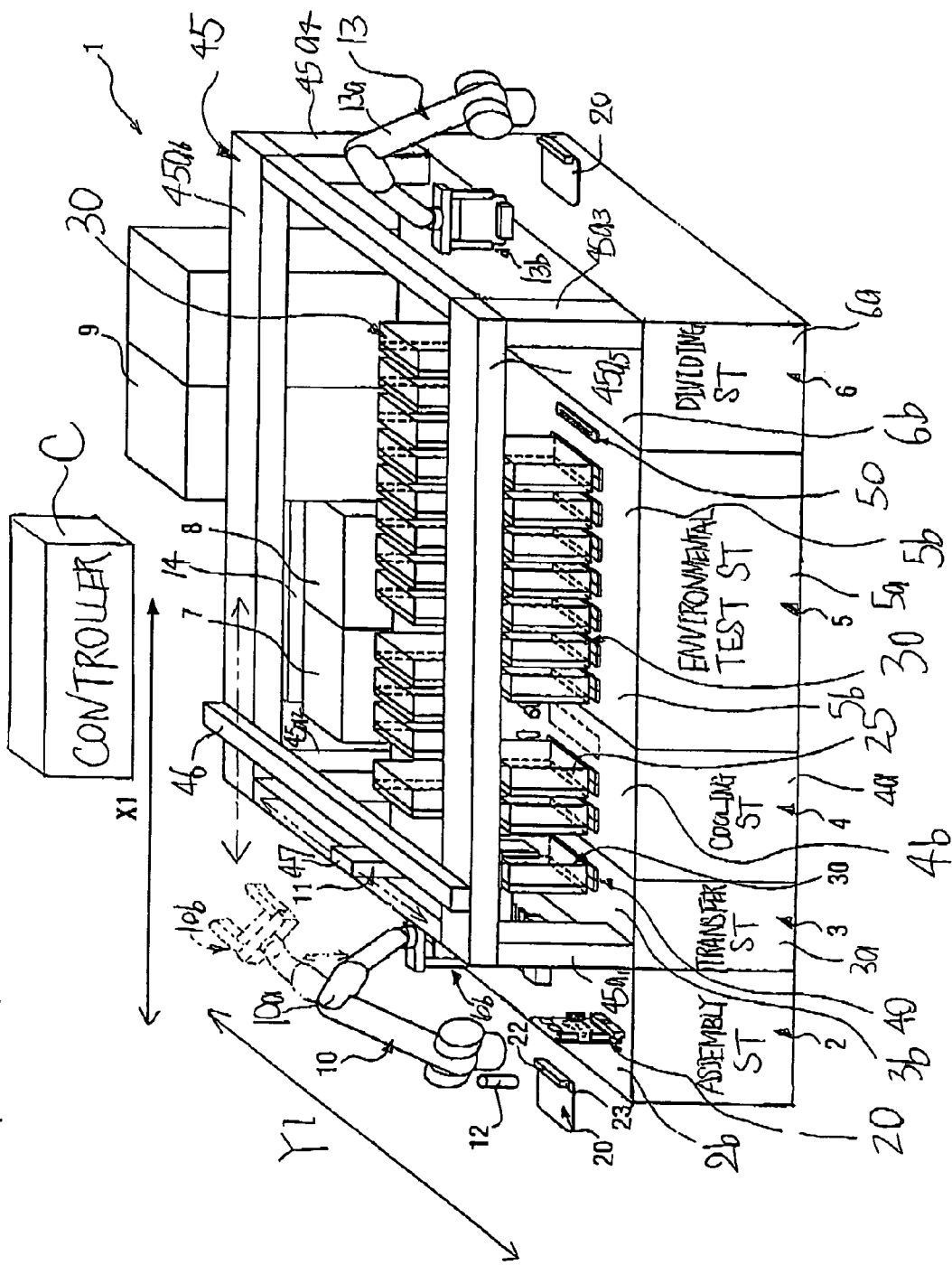
FIG. 1 is a perspective view schematically illustrating a whole structure of an environmental test system according to an embodiment of the present invention.

FIG. 1 is a perspective view schematically illustrating a whole structure of an environmental test system according to this embodiment of the present invention. The environmental test system is referred to simply as "test system" hereinafter.

As shown in FIG. 1, the test system 1 is provided with an assembly stage (ST) 2, a transfer stage 3, a cooling stage 4, an environmental test stage 5, and a non-defective/defective dividing stage 6.

The test system 1 also has a cooling unit 7, a heating unit 8, an energizing unit 9, a first vertical articulated (multi-joint) robot 10, an X-Y (horizontal) transfer robot 11, a code reader 12, a second vertical articulated robot 13, and a dehumidifier unit 14.

The test system 1 has a controller C coupled to the first vertical robot 10, the cooling unit 7, the heating unit 8, and the energizing unit 9, respectively, whereby the controller C is operative to control them.

The test system 1 according to this embodiment is designed to assemble a circuit board (circuit substrate) 20 to be tested and a test chamber housing 25 to form a test assembly 30. The test system 1 is also designed to perform an environmental test for the circuit board 20 of the test assembly 30.

The circuit board 20 to be tested, as shown in FIG. 2, has a substrate 21, a connector 23 mounted at its one surface on one peripheral end portion of one surface of the substrate 21, and various types of electronic components 24 mounted on the one surface of the substrate 21 and electrically connected to the connector 23. The connector 23 has an identification code 22, such as barcode, attached to the other surface of the connector 23.

The connector 23 has a socket portion 23a to which electrical components can connect. The socket portion 23a projects from the one peripheral end portion of the one surface of the substrate 21 outwardly along the one surface of the circuit board 20.

The assembly stage 2 has, for example, a substantially rectangular-parallelepiped base portion 2a with a top surface area 2b served as an assembly area. Similarly, the transfer stage 3, the cooling stage 4, the environmental test stage 5, and the non-defective/defective dividing stage 6 have substantially rectangular-parallelepiped base portions 3a, 4a, 5a, and 6a. The base portions 3a, 4a, 5a, and 6a have top surface areas 2b, 3b, 4b, 5b, and 6b that are served as transfer area, cooling area, environmental test area, and non-defective/defective dividing area, respectively.

The assembly area 2b, the transfer area 3b, the cooling area 4b, the environmental test area 5b, and the non-defective/defective dividing area 6b are arranged closely or continuously in a row along a first direction shown in arrow X1, providing an environmental test line.

When the circuit boards 20, which have already been subjected to a previous process to the environmental test process, such as appearance check process, by an appearance checking machine (not shown) is transferred therefrom, each of the circuit boards 20 is sequentially supplied to the assembly area 2b of the assembly stage 2. That is, the assembly area 2b (assembly stage 2) is the first stage of the environmental test line.

The test system 1 is equipped with a code reader 12 installed close to the assembly area 2b and electrically connected to the controller C. The first vertical articulated robot 10 is installed on the periphery of the assembly area 2b of the base portion 2a and is electrically communicable with the controller C.

As the first vertical articulated robot 10, one of well-known articulated arm robots is used. That is, the first vertical articulated robot 10 has a long body 10a fixedly located at its one end on the periphery of the assembly area 2b. The first vertical articulated robot 10 has at its other end with a grip mechanism 10b for holding (gripping) or releasing the circuit board 20.

The long body 10a incorporates a plurality of links and a plurality of joints that connect between the adjacent links, respectively. The joints allow the grip mechanism 10b to move three-dimensionally over the assembly area 2b and the transfer area 3b.

The links and the grip mechanism 10b are electrically connected to the controller C so that the controller C can control the three-dimensional movement of the vertical articulated robot 10 and the holding or releasing action.

The test system 1 is also equipped with a plurality of connector chucks 40 (see FIGS. 3A–3D and 4A–4E) mounted on the assembly area 2b.

On the assembly area 2b, the circuit board 20, after the identification process, is held by the first vertical articulated robot 10 and transferred on the connector chuck 40 mounted on the assembly area 2b so that the circuit board 20 is fixedly held by the connector chuck 40.

After that, the test chamber housing 25 for defining a test chamber, which is previously prepared on the assembly area 2b, is transferred by the vertical circuit robot 10 so that the circuit board 20 supported by the connector chuck 40 is contained in the test chamber housing 25, thereby forming the assembly 30. This assembling process for the circuit board 20, the connector chuck 40, and the test chamber housing 25 will be described hereinafter in detail.

After the assembling process, the first vertical articulated robot 10 holds the assembly 30 to transfer it on the transfer area 3b of the transfer stage 3.

The X-Y transfer robot 11 has a frame 45 composed of four base poles 45a1–45a4. The base poles 45a1 and 45a2 are mounted on the laterally peripheral end portions of the transfer area 3b in standing conditions, respectively. The remaining poles 45a3 and 45a4 are mounted on the laterally peripheral end portions of the non-defective/defective dividing area 6b in standing conditions, respectively, so that the base poles 45a1 and 45a3 are aligned along the first direction X1 and the base poles 45a2 and 45a4 are aligned along the first direction X1, respectively.

The frame 45 is also composed of a pair of supporting bars 45a5 and 45a6. The supporting bar 45a5 is disposed on the top end portions of the base poles 45a1 and 45a3 to bridge between them in parallel to the first direction X1. Similarly, the supporting bar 45a6 is disposed on the top end portions of the base poles 45a2 and 45a4 to bridge between them in parallel to the first direction X1.

The X-Y transfer robot 11 has a transfer bar 46 supported at its both ends to the supporting bars 45a5 and 45a6, respectively, so that the transfer bar 46 is movable along the first direction X1 over the areas 3b–6b. The X-Y transfer robot 11 has an X1 transfer mechanism (not shown) electrically connected to the controller C so that the controller C is operative to send commands to the X1 transfer mechanism to control the movement of the transfer bar 46 along the first direction X1 by the X1 transfer mechanism.

The X-Y transfer robot 11 also has an arm member 47 hanged at its one end by the transfer bar 46 to be movable along the longitudinal direction of the transfer bar 46. The longitudinal direction of the transfer bar 46 is a second direction shown in arrow Y1. The X-Y transfer robot 11 has a Y1 transfer mechanism (not shown) electrically connected to the controller C whereby the controller C is operative to feed commands to the Y1 transfer mechanism to control the movement of the arm member 47 along the second direction Y1 by the Y1 transfer mechanism.

The X-Y transfer robot 11 is also provided with a grip mechanism 48 attached to the other end of the arm member 47 for holding or releasing the assembly 30.

The grip mechanism 48 is electrically connected to the controller C so that the controller C is operative to control the holding and releasing actions of the grip mechanism 48.

On the other hand, the dehumidifier unit 14 (see FIGS. 1 and 5) is provided with an air sucking port 14a and contains a dehumidification member, such as silica gel. The dehumidifier unit 14 eliminates, by means of the dehumidification member, moisture in air, which is located outside of the assembly 30 and is sucked through the air sucking port 14a, to convert the moisture-eliminated air into a low dew point air. The low dew point air has an ordinary temperature, such as 25 degrees.

That is, on the transfer area 3b of the transfer stage 3, the dehumidifier unit 14 supplies the low dew point air to the inside of the assembly 30.

After that, the assembly 30 is transferred on the cooling area 4b of the cooling stage 4 by the X-Y transfer robot 11.

The low dew point air is defined as air having a dew point temperature that is lower than a predetermined cooling temperature described hereinafter.

On the cooling area 4b of the cooling stage 4, the environment surrounding the circuit board 20 in the assembly 30 is cooled by the cooling unit 7. That is, the cooling unit 7 is equipped with a cooler through which a predetermined coolant flows with its temperature being kept no more than a predetermined temperature. The predetermined temperature of the predetermined coolant is controlled by the controller C in which the predetermined temperature is previously determined to be stored.

The cooling unit 7 is closely coupled to the dehumidifier unit 14 through a first pipe P1, allowing establishing air communication therebetween.

That is, the low dew point air is cooled by the cooling unit 7 up to the predetermined cooling temperature that is, for example, not more than minus 25 degrees. The low dew point air with the predetermined cooling temperature is fed into the assembly 30 through a second pipe P2 for a predetermined cooling period, such as 135 seconds, so that the environment surrounding the circuit board 20 is cooled. The controller C controls the cooling unit 7 so that the cooling unit 7 supplies the low dew point air with the predetermined cooling temperature to the inside of the assembly 30 for the predetermined cooling period. The predetermined cooling period is controlled by the controller C in which the predetermined cooling period is previously determined to be stored.

After the completion of feeding the low dew point air into the assembly 30, the assembly 30 is transferred to the environmental test area 4b by the X-Y transfer robot 11.

The environmental test stage 4 is provided with a plurality of cable units 50 mounted on the environmental test area 4b.

On the environmental test area 4b, the assembly 30 is transferred by the X-Y transfer robot 11 on the cable unit 50. The cable unit 50 is served as an electrical connector (cable) and an air communication path between the heating unit 8 and the inside of the assembly 30.

The heating unit 8 is closely coupled to the dehumidifier unit 14 through a third pipe P3, which enables establishing air communication therebetween.

The heating unit 8 is equipped with a heater. The low dew point air supplied from the dehumidifier unit 14 flows through the heater to be heated thereby.

Figure 5:
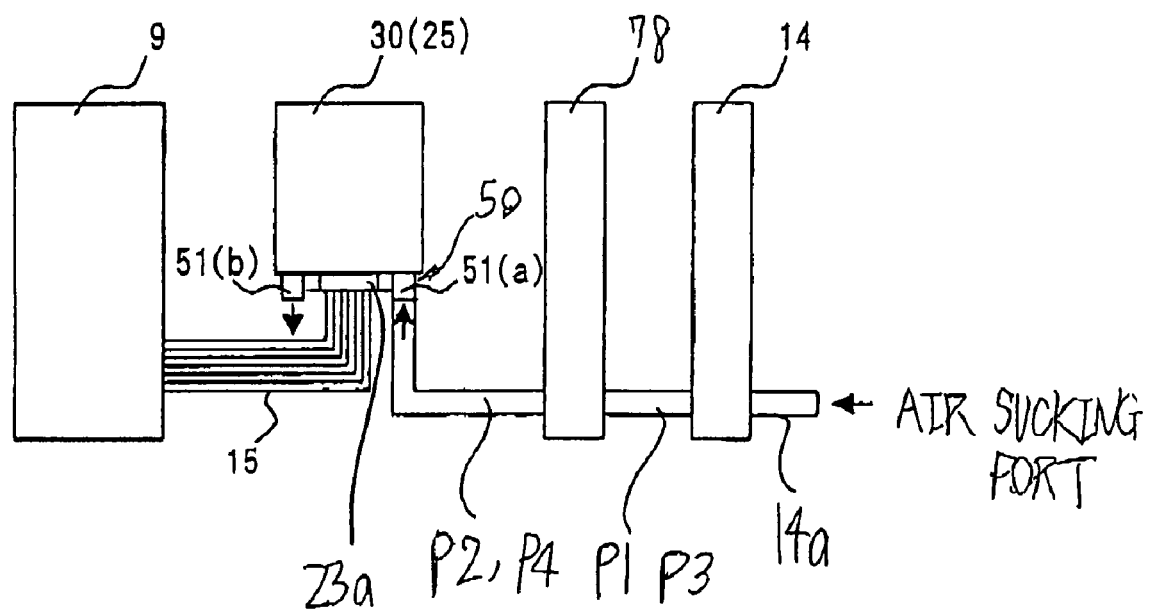
FIG. 5 is a view schematically illustrating the interconnections among a cooling unit, a heating unit, an energizing unit, and an assembly.

The cable unit 50 is closely connected to the heating unit 8 through a fourth pipe P4 and is electrically coupled via a plurality of cables 15 to the energizing unit 9 (see FIG. 5).

When the assembly 30 is transferred to be located on the cable unit 50 by the X-Y transfer robot 11, the cable unit 50 can establish air communication between the assembly 30 and the heating unit 8 through the fourth pipe P4. The cable unit 50 also allows the connector 23 of the assembly 30 to be electrically connected to the energizing unit 9. The structure of the cable unit 50 will be described hereinafter in detail.

On the environmental area 4b, when the electrical communication between the circuit board 20 and the energizing unit 9 and the air communication between the inside of the assembly 30 and the heating unit 8 are established, the environmental test is carried out with respect to the assembly 30 (circuit board 20).

That is, the low dew point air having the ordinary temperature and the low dew point air having a high temperature, such as 85 degrees, higher than the ordinary temperature are supplied from the heating unit 8 to the inside of the assembly 30 while a predetermined voltage is applied on the circuit board 20 from the energizing unit 9.

The supplying timings of the low dew point air with the ordinary temperature and the low dew point air with the high temperature, the ordinary and high temperatures, and the voltage applying timing are controlled by the controller C.

In particular, while the energizing unit 9 applies the predetermined voltage on the circuit board 20 through the cable unit 50, the heating unit 8 keeps the heater off and feeds the low dew point air with the ordinary temperature, which is supplied from the dehumidifier unit 14, to the inside of the assembly 30 for a first predetermined period of, for example, 2 minutes.

After supplying the low dew point air, the heating unit 8, in response to a control signal sent from the controller C, turns the heater on to heat the low dew point air with the ordinary temperature, which is supplied from the dehumidifier unit 14, so that the temperature of the heated low dew point air reaches the high temperature, such as 85 degrees. The heating unit 8 feeds the low dew point air with the high temperature to the inside of the assembly 30 for a second predetermined period of, for example, 8 minutes.

The heating temperature of the low dew point air and the first and second predetermined periods are controlled by the controller C in which the ordinary and high temperatures and the first and second predetermined periods are previously determined to be stored.

Similarly, the applied voltage value and the period of applying the voltage value are controlled by the controller C in which environmental test conditions that can define the applied voltage value and the period of applying the voltage value are previously determined to be stored.

After the completion of the environmental test, the assembly 30 is transferred to the non-defective/defective dividing area 6b.

The second vertical articulated robot 13 is installed on the non-defective/defective dividing area 6b of the base portion 6a and is electrically communicable with the controller C. The second vertical articulated robot 13 has a substantially identical configuration of the vertical articulated robot 10. That is, the second vertical articulated robot 13 is composed of a long body 13a corresponding to the long body 10a and a grip mechanism 13b corresponding to the grip mechanism 10b.

On the non-defective/defective dividing area 6b, the assembly 30 transferred by the X-Y transfer robot 11 is disassembled by the second vertical articulated robot 13 so that the assembly 30 is divided into the test chamber housing 25, the connector chuck 40, and the circuit board 20.

The controller C determines whether the disassembled circuit board 20 is non-defective or defective according to the environmental test result, and if the controller C determines that the disassembled circuit board 20 is defective, the circuit board 20 is marked to identify that it is defective. The defective-marked circuit board 20 is carried out to a defective stage (not shown).

If the controller C determines that the disassembled circuit board 20 is non-defective, the circuit board 20 is marked to identify that it is non-defective. The non defective-marked circuit board 20 is carried out to a non-defective stage (not shown). The disassembled test chamber housing 25 and the connector chuck 40 are returned to the assemble area 2b by the second vertical articulated robot 13 and the X-Y transfer robot 11.

Next, the structure of the assembly 30 and the assembling processes thereof are described FIG. 3A is a schematic plan view illustrating the connector chuck 40 in a state prior to the hold of the circuit board 20, and FIG. 3B is an enlarged schematic cross sectional view taken on line IIIB—IIIB shown in FIG. 3A.

FIG. 3C is a schematic plan view illustrating the connector chuck 40 in a state after the hold of the circuit board 20, and FIG. 3D is an enlarged schematic cross sectional view taken on line IIID—IIID shown in FIG. 3C.

In addition, FIG. 4 is a schematic perspective view illustrating the assembling processes of the assembly 30. That is, FIG. 4A illustrates a procedure of mounting the circuit board 20 on the connector chuck 40, and FIG. 4B illustrates a procedure of fixedly supporting the circuit board 20 by the connector chuck 40. FIG. 4C illustrates a procedure of putting the test chamber housing 25 over the connector chuck 40 to which the circuit board 20 is fixedly supported so that the test chamber housing 25 is engaged with the connector chuck 40, whereby to assemble the assembly 30, and FIG. 4D illustrates the assembly 30 and the circuit board 20 contained therein.

The assembly 30 has the single test chamber housing 25 allowing the single circuit board 20 to be contained therein. In the assembly 30, the circuit board 20 is closely contacted to be removably supported to the connector chuck 40. The connector chuck 40 is closely contacted to be removably supported to the test chamber housing 25.

The test chamber housing 25 has, for example, walls forming a substantially rectangular-parallelepiped box shape, and the walls are made of thermal insulating material.

The test chamber housing 25 may preferably have a predetermined capacity that minimum required for containing the circuit board 20 to efficiently change the temperature in the test chamber housing 25.

The test chamber housing 25 is formed at its one side wall 25*a* with an opening 25*b* allowing the circuit board 20 to be inserted in the test chamber housing 25. A packing member is closely fitted to the inner peripheral surface of the opening 25. The shape of opening 25*a* is decided such that, when the housing 25 is put over the connector chuck 40 to contain the circuit board 20, the connector chuck 40 is closely fitted through the packing member in the opening 25*a* to be hermetically sealed therein.

The housing 25 is provided with a supply port 25*c*1 and a discharge port 25*c*2 penetrated through the opposing lateral side portions of the one side wall 25*a*, respectively.

The connector chuck 40 is provided with a pair of plate-like supporting members 40*a* and 40*b* mounted at their one surfaces on the assembly area 2*b*, respectively. One of the longitudinal surfaces, for example, surface 40*a*1, of the supporting member 40*a* is opposite and parallel to one of the longitudinal surfaces, for example, surface 40*b*1, of the supporting member 40*b*. Each lateral side surface of the supporting member 40*a* is aligned to each lateral side surface of the supporting member 40*b*.

The connector chuck 40 is also provided with support flames SF1 and SF2. The lateral side surfaces of the supporting members 40*a* and 40*b* are supported by the support flames SF1 and SF2 so that the supporting members 40*a* and 40*b* are movable along their lateral side direction.

The longitudinal side surface 40*a*1 of the supporting member 40*a* is formed with a supporting groove 40*c* toward the other longitudinal side surface of the supporting member 40*a*. The supporting groove 40*c* allows the projecting socket portion 23*a* of the socket 23 to be fitted therein.

The connector chuck 40 is also provided with a pair of spring members 41, 41. One of the spring members 41, for example, is buried in one end of the supporting member 40*a* and one end of the supporting member 40*b*. Similarly, the other of the spring members 41, for example, is buried in the other end of the supporting member 40*a* and the other end of the supporting member 40*b*. That is, the spring members 41, 41 couple between the supporting members 40*a* and 40*b*.

The pair of spring members 41 urges that the supporting members 40*a* and 40*b* are close to each other so that, when no force is applied on the supporting members 40*a* and 40*b*, the supporting members 40*a* and 40*b* are contacted at their opposing longitudinal surfaces 40*a*1 and 40*b*1 with each other.

On the longitudinal side surface 40*b*1 of the supporting member 40 and the inner surface of the supporting groove 40*c*, which are to be contacted to the projecting socket portion 23*a* of the socket 23 of the circuit board 20, packing members 44 are attached, respectively.

The connector chuck 40 is formed at the support frames SF1 and SF2 with positioning holes 42 for defining positional relationships between the connector chuck 40 and the cable unit 50.

The connector chuck 40 is further provided with a guide portion 43 projecting orthogonally from the other surface of the supporting member 40*a*. The guide portion 43 is formed at its projecting end with an engaging portion 43*a* extending toward the supporting member 40*b* in parallel to the other surface of the supporting member 40*a*. A packing member 44 is attached on the inner surface of the engaging portion 43*a*.

When the projecting socket portion 23*a* of the circuit board 20 is fitted in the supporting groove 40*c*, the socket 23 is contacted to the guide portion 43 to be engaged with the engaging portion 43*a* through the packing member 44.

Next, the assembling method of the assembly 30 composed of the circuit board 20, the test chamber housing 25, and the connector chuck 40 are described.

As shown in FIGS. 3A and 3B, when the supporting members 40*a* and 40*b* are subjected to forces F against the urging forces of the springs 41, 41, the supporting members 40*a* and 40*b* are separated from each other so that a clearance is formed around the supporting groove 20*c*.

In a state that the supporting members 40*a* and 40*b* are kept separated, the first vertical articulated robot 10 holds the circuit board 20 with the grip mechanism 10*b*, and transfers the circuit board 20 to insert the socket portion 23*a* of the circuit board's socket 23 into the supporting groove 20*c*. The clearance allows smooth insertion of the socket portion 23*a* into the supporting groove 20*c*.

This insertion is completed when the socket portion 23*a* of the socket 23 is contacted to the guide portion 43 and engaged with the engaging portion 43*a*.

After the insertion of the socket portion 23*a*, as shown in FIGS. 3C and 3D, when the supporting members 40*a* and 40*b* are subjected to no force, as shown in FIG. 4B, the urging forces of the springs 41 move the supporting members 40*a* and 40*b* to be close to each other.

As a result, the supporting members 40*a* and 40*b* of the connector chuck 40 are closely contacted to the socket portion 23*a* of the socket 23 to clamp it tightly by the urging forces. Incidentally, when releasing the circuit board 20 from the connector chuck 40, the reversing processes of the holding processes of the circuit board 20 should be carried out.

Subsequently, the first vertical articulated robot 10 holds the test chamber housing 25 to transfer it. The first vertical articulated robot 10 puts the test chamber housing 25 over the circuit board 20 supported by the connector chuck 40 so that the circuit board 20 is inserted through the opening 25*b* into the test chamber housing 25. The connector chuck 40 is closely fitted in the opening 25*b* of the test chamber housing 25, which allows the circuit board 20 to be substantially airtightly contained in the test chamber housing 25 (see FIG. 4D). As a result, the assembly 30 is completed.

Next, the structure of the cable unit 50 and the connecting procedure of the assembly 30 to the cable unit 50 are described.

Figure 4E:
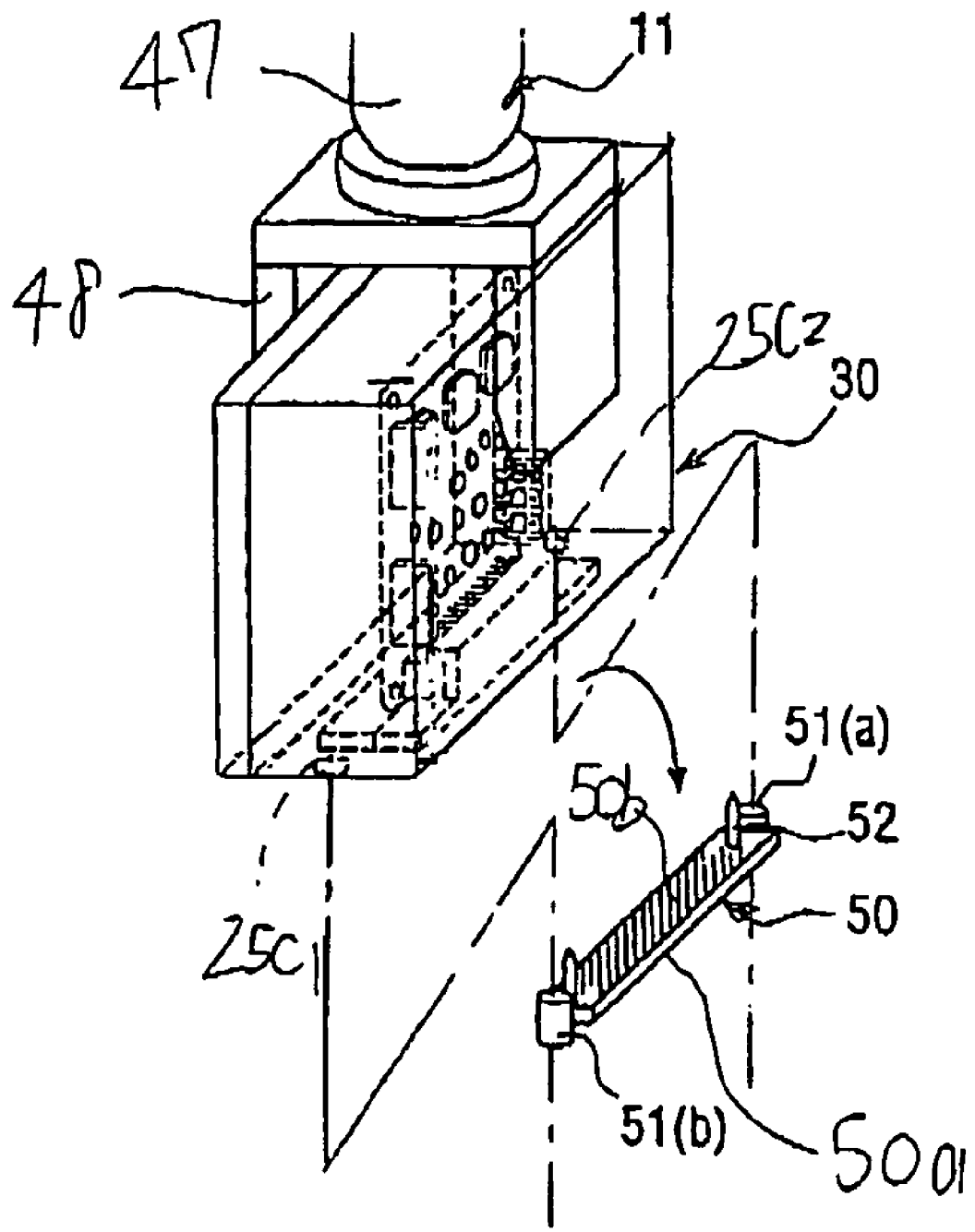
FIG. 4E is a schematic perspective view illustrating a process of coupling the assembly to a cable unit according to the embodiment of the invention.

The cable unit 50, as shown in FIG. 4E, is provided with a bar plate 50*a*. The bar plate 50*a* is formed at its center with a connector portion 50*b* that is linearly arranged and can be mechanically electrically coupled with the socket portion 23*a* of the socket 23. The bar plate 50*a* is also formed at its both ends with a supply port 51(*a*) and a discharge port 51(*b*), respectively.

The supply port 51(*a*) and the discharge port 51(*b*) allow the air supplied through the supply port 51(*a*) into the assembly 30 to circulate in the assembly 30 and to be discharged through the discharge port 51(*b*).

When the socket portion 23*a* of the socket 23 is mechanically electrically coupled with the connector portion 50*b* of the cable unit 50, the peripheral portion of the supply port 25*c*1 is closely airtightly contacted with the peripheral portion of the supply port 51(a) of the cable unit 50, and the supply port 25c1 is aligned to the supply port 51(a) to be communicated thereto.

Similarly, when the socket portion 23a of the socket 23 is mechanically electrically coupled with the connector portion 50b of the cable unit 50, the peripheral portion of the discharge port 25c2 is closely airtightly contacted with the peripheral portion of the discharge port 51(b) of the cable unit 50, and the discharge port 25c2 is aligned to the discharge port 51(b) to be communicated thereto.

The bar plate 50a is further formed at both sides of the connector portion 50b with positioning pins 52, respectively. The positioning pins 50a are located in correspondence with the positioning holes 42 to project from the bar plate 50a in standing conditions.

That is, when the socket portion 23a of the socket 23 is mechanically electrically coupled with the connector portion 23a of the cable unit 50, the positioning pins 52 are inserted to be fitted into the positioning holes 42 of the connector unit 40 so that the positioning relationships between the connector unit 40, that is, the assembly 30 and the cable unit 50 are accurately determined.

Next, the cooling and heating processes of the environment surrounding the circuit board 20 in the assembly 30, and the energizing process to the circuit board 20 are described in accordance with FIG. 5.

FIG. 5 schematically illustrates the interconnections among the cooling unit 7, the heating unit 8, the energizing unit 9, and the assembly 30.

As described above, when the air located outside of the assembly 30 is sucked through the air sucking port 14a, the dehumidifier unit 14 eliminates, by means of the dehumidification member, moisture in the sucked air to convert it into the low dew point air having the dew point temperature lower than the predetermined cooling temperature.

That is, even if the outside air passing through the dehumidification member of the dehumidifier unit 14 is cooled and the cooled air is contacted to the circuit board 20, it is possible to prevent dewdrops from occurring on the surfaces of the circuit board 20 because the moisture in the cooled air is eliminated.

In the environmental test processes, one of the low dew point air that is cooled by the cooling unit 7 and the low dew point air that is heated by the heating unit 8 is supplied through the cable unit 50 to the inside of the assembly 30. This structure controls the temperature of the environment surrounding the circuit board 20 in the assembly 30.

In addition, in the environmental test processes, the voltage supplied from the energizing unit 9 is applied on the circuit board 20 through the cable unit 50 and the cables 15 while controlling the temperature of the environment surrounding the circuit board 20 in the assembly 30.

When applying the voltage on the circuit board 20, the cables 15 are electrically connected through the cable unit 50 to the connector portion 23a of the circuit board 20. After the connections, the voltage is applied on the circuit board 20 by the energizing unit 9 in accordance with the environmental test conditions based on the control of the controller C.

Next, the operations of the environmental test system 1 for performing the environmental test processes will be described hereinafter.

Figure 6:
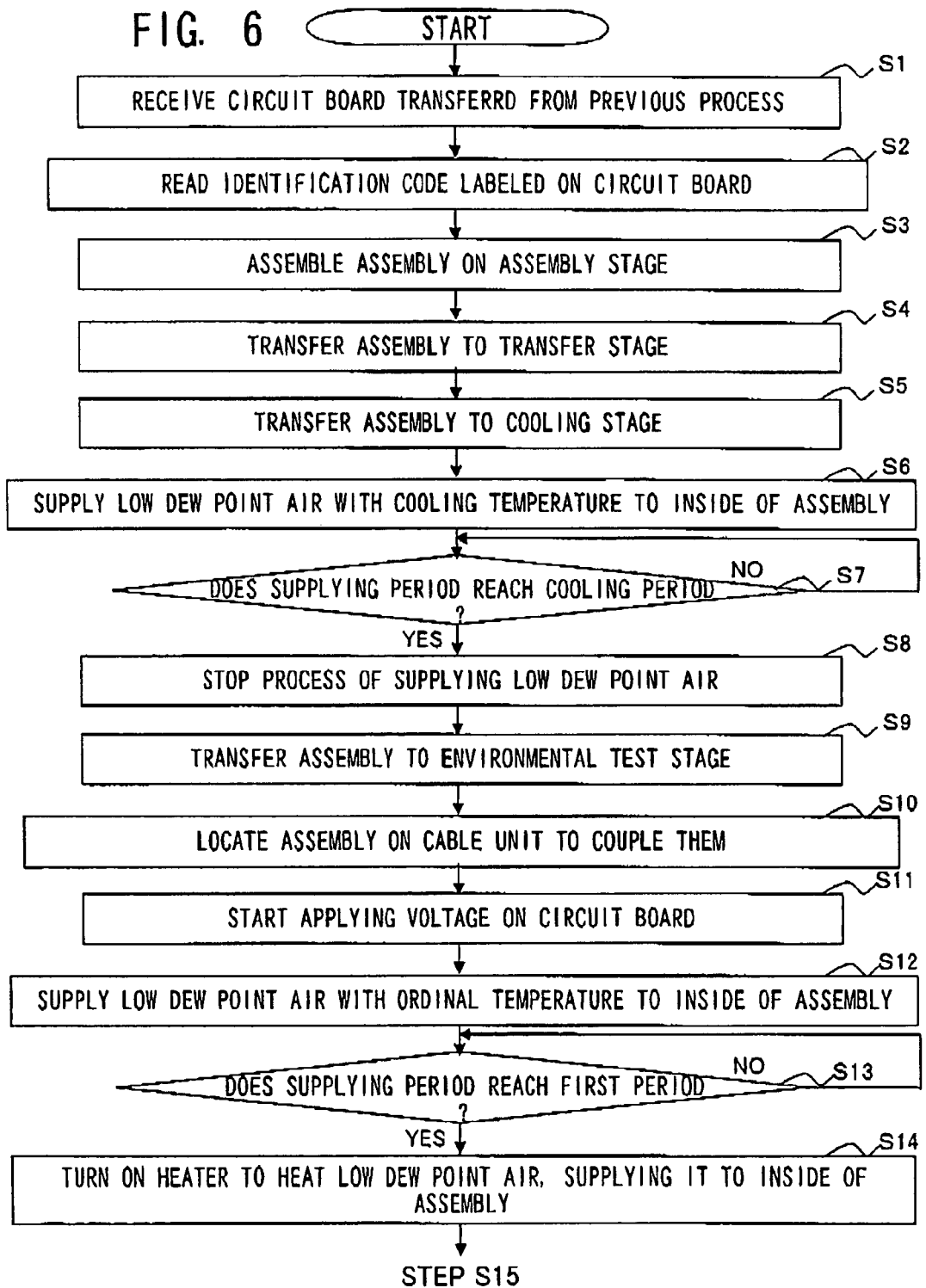
FIG. 6 is a flowchart illustrating operation procedures of the environmental test system according to the embodiment of the invention.
Figure 7:
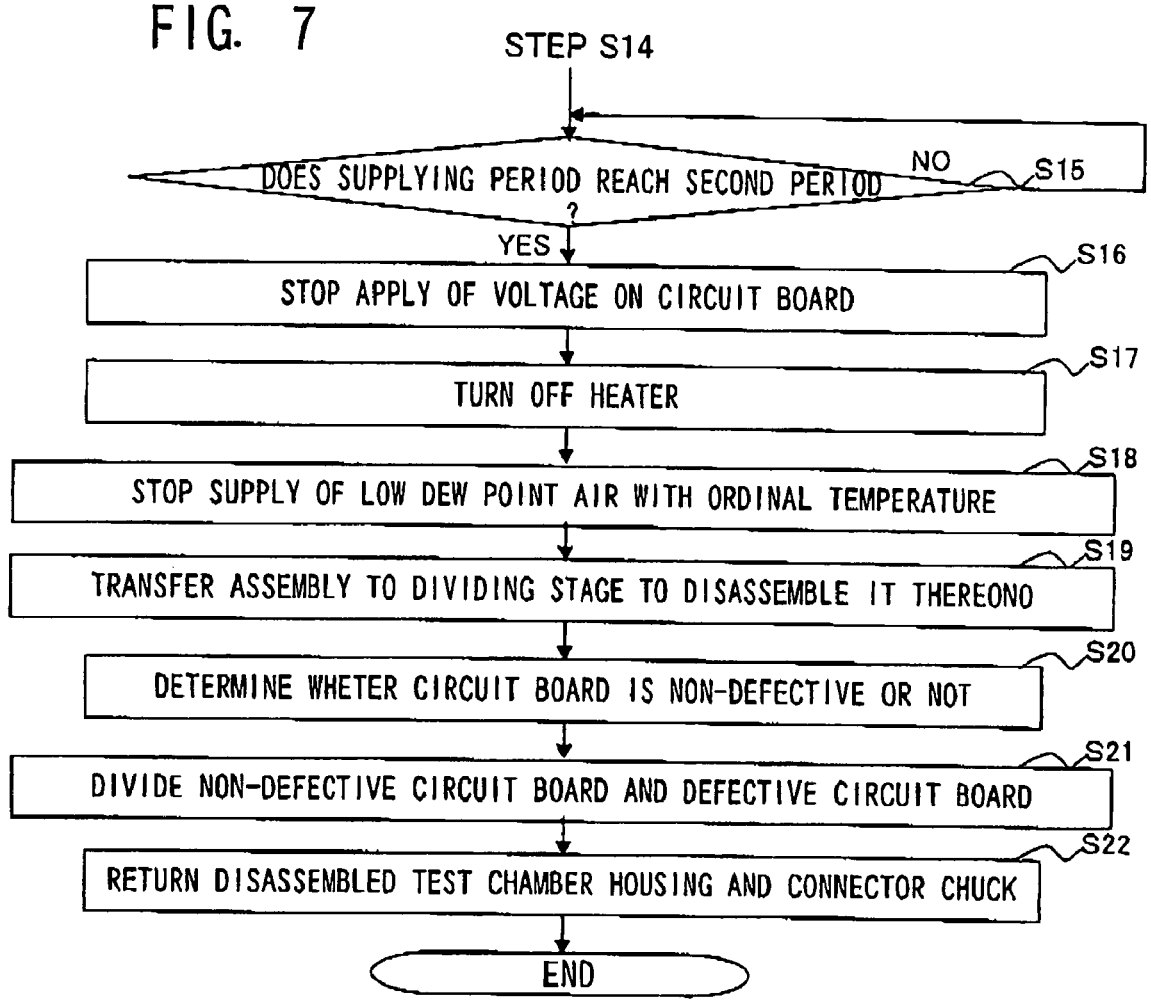
FIG. 7 is a flowchart illustrating the operation procedures of the environmental test system according to the embodiment of the invention.
Figure 8:
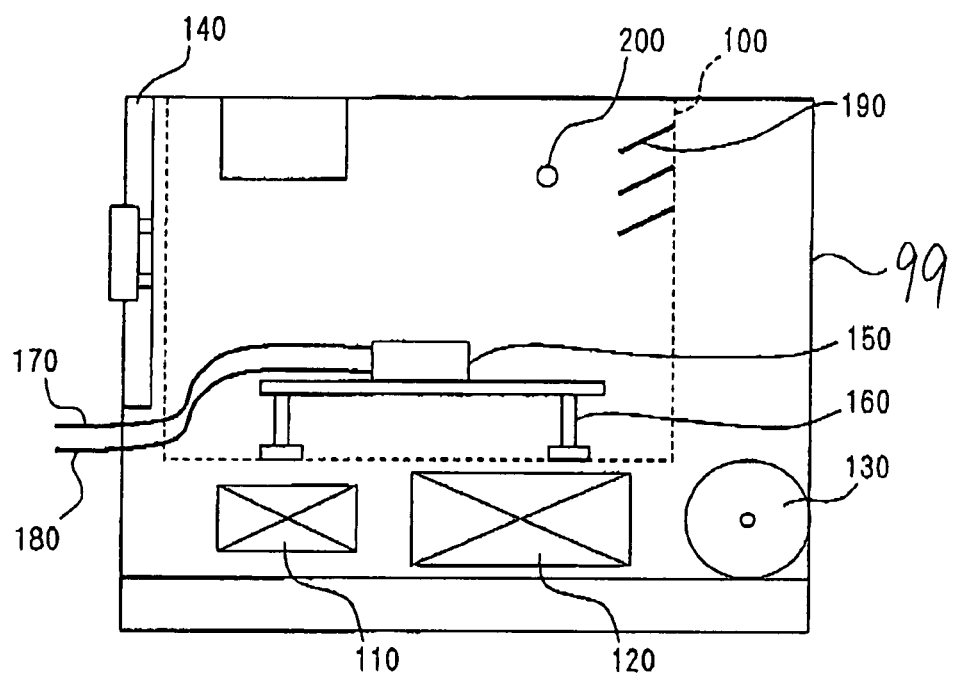
FIG. 8 is a partially cross sectional view of a part of a conventional environmental test system.

FIGS. 6 and 7 are flowcharts illustrating operation procedures of the test system 1 according to this embodiment.

That is, in step S1, after the completion of the previous process, such as appearance check process, when the circuit board 20 is transferred from the previous process, the controller C of the test system 1 controls the first vertical articulated robot 10 to receive the circuit board 20 with the grip mechanism 10b, the controller C shifting to next step S2.

In step S2, the controller C controls the first vertical articulated robot 10 to transfer the circuit board 20 to a position allowing the code reader 12 of the test system 1 to read the identification code 22 labeled on the connector 23 of the circuit board 20. The controller C controls the code reader 12 to read the identification code and to send the read identification code to the controller C. The controller C identifies the circuit board 20 to be tested.

After the identification process, the controller C controls the first vertical articulated robot 10 to transfer the identified circuit board 20 to the assembly stage 2a, shifting to next step S3.

In Step S3, as described above, the controller C controls the first vertical articulated robot 10 to assemble the transferred circuit board 20, the connector chuck 40, and the test chamber housing 25 on the assembly area 2b to produce the assembly 30, shifting to next step S4.

In step S4, the controller C controls the first vertical articulated robot 10 to transfer the assembly 30 assembled on the assembly area 2b to the transfer stage 3a to be located on the transfer area 3b.

On the transfer area 3b, the controller C controls the dehumidifier unit 14 to supply the low dew point air with the ordinal temperature to the inside of the assembly 30 through the supply port 51a thereof, shifting to step S5.

In step S5, the controller C controls the X-Y transfer robot 11 to hold the assembly 30 with the grip mechanism 48 and to transfer it to the cooling stage 4a so that the assembly 30 is located on the cooling area 4b, shifting to step S6.

In step S6, the controller C controls the cooling unit 7 to supply the low dew point air with the predetermined cooling temperature to the inside of the assembly 30, thereby causing the low dew point air to circulate in the assembly 30, shifting to step S7.

In step S7, the controller C determines whether the supplying period of the low dew point air with the predetermined cooling temperature reaches the predetermined cooling period, such as 135 seconds.

If the determination is YES, that is, the supplying period reaches the predetermined cooling period, the controller C shits to step S8 and controls the cooling unit 7 to stop the process of supplying the low dew point air, shifting to step S9.

If the determination is NO, that is, the supplying period does not reach the predetermined cooling period, the controller C returns to execute the process of step S7 while continuing the low dew point air supplying process in step S6.

In step S9, the controller C controls the X-Y transfer robot 11 to transfer the assembly 30 in which the low dew point air having the predetermined cooling temperature to the environmental test stage 5, shifting to step S10.

In step S10, the controller C controls the X-Y transfer robot 11 to locate the assembly 30 on the cable unit 50 so that the cable unit 50 allows establishing the electrical coupling between the energizing unit 9 and the circuit board 20, and the air communication between the heating unit 8 and the inside of the assembly 30.

After the electrical coupling and air communication are established, in step S11, the controller C controls the energizing unit 9 to start applying the voltage on the circuit board 20, shifting to step S12.

In step S12, the controller C controls the heating unit 8. The heating unit 8, based on the control of the controller C, keeps the heater off and supplies the low dew point air with the ordinal temperature to the inside of the assembly 30 in which the circuit board 20 being subjected to the voltage is installed. The supplied low dew point air with the ordinal temperature circulates in the assembly 30. The controller C shifts to step S13.

In step S13, the controller C determines whether the supplying period of the low dew point air with the ordinal temperature reaches the first predetermined period, such as 2 minutes.

If the determination is YES, that is, the supplying period reaches the first predetermined period, the controller C shits to step S14.

Then, the result of environmental test for applying the voltage on the circuit board 20 while maintaining the environmental temperature surrounding the circuit board 20 to the ordinal temperature is determined to be stored on the controller C.

If the determination is NO, that is, the supplying period does not reach the first predetermined period, the controller C returns to execute the process of step S13 while continuing the low dew point air supplying process in step S12.

In step S14, the controller C controls the heating unit 8 to turn the heater on so as to heat the low dew point air with the ordinal temperature, thereby setting the temperature of the heated low dew point air to the high temperature, such as 85 degrees. The controller C controls the heating unit 8 to supply the heated low dew point air with the high temperature to the inside of the assembly 30, thereby causing the supplied low dew point air to circulate in the assembly 30, shifting to step S15.

In step S15, the controller C determines whether the supplying period of the low dew point air with the high temperature approaches the second predetermined period, such as 8 minutes.

If the determination is YES, that is, the supplying period reaches the second predetermined period, the controller C shits to step S16, thereby controlling the energizing unit 9 to stop the apply of voltage on the circuit board 20. In addition, the controller C, in step S17, controls the heating unit 8 to turn off the heater.

The result of environmental test for applying the voltage on the circuit board 20 while maintaining the environmental temperature surrounding the circuit board 20 to the high temperature is determined to be stored on the controller C.

If the determination is NO, that is, the supplying period does not reach the second predetermined period, the controller C returns to execute the process of step S15 while continuing the low dew point air supplying process in step S14.

Subsequently, in step S18, the controller C controls the heating unit 8 to stop the supply of the low dew point air with the ordinal temperature, shifting to step S19. In step S19, the controller C controls the X-Y transfer robot 11 to transfer the assembly 30 to the non-defective/defective dividing stage 6. Subsequently, the controller C controls the second vertical articulated robot 13 to disassemble the assembly 30 into the circuit board 20, the test chamber housing 25, and the connector chuck 40, shifting to step S20.

In step S20, the controller C determines whether the circuit board 20 is non-defective or defective according to the results of the environmental test, shifting to step S21.

In step S21, if the circuit board 20 is determined to be non-defective, the controller C controls the second vertical articulated robot 13 to hold the circuit board 20, thereby transferring the circuit board 20 to the non-defective stage. If the circuit board 20 is determined to be defective, the controller C controls the second vertical articulated robot 13 to hold the circuit board 20, thereby carrying out the circuit board 20 to the defective stage.

Subsequently, in step S22, the controller C controls the second vertical articulated robot 13 to pick up each of the disassembled test chamber housing 25 and the connector chuck 40. Next, the controller C controls the X-Y transfer robot 11 to return the held test chamber housing 25 and the connector chuck 40 to the assembly stage 2 (the assembly area 2b).

These environmental test processes are repeated for each circuit board that is sequentially transferred from the previous process.

As described above, the structure of the environmental test system 1 and the environmental test processes allow supplying the low dew point air having the dew point temperature lower than the predetermined cooling temperature to the inside of the assembly 30 in which the circuit board 20 to be tested is contained.

Even if, therefore, the low dew point air is cooled to have the predetermined cooling temperature and is supplied to the inside of the assembly 30, it is possible to prevent the formation of any dew condensation on the circuit board 20 because the dew point temperature of the low dew point air is lower than that of the predetermined cooling temperature.

As a result, this structure of the test system 1 and the environmental test processes can avoid the occurrence of migrations in the electric component 24 and that of electric corrosion therein due to dewdrops.

Moreover, according to this embodiment, arranging the cooling unit 7, the heating unit 8, the energizing unit 9, and the dehumidifier unit 14 outside of the assembly 30, that is, the test chamber housing 25 allows the whole size of the test chamber housing 25 to be reduced. This downsized test chamber housing 25 allows the temperature in the test chamber housing 25 to be controlled with a high degree of accuracy without increasing the cooling performance of the cooling unit 7 and the heating performance of the heating unit 8. That is, the downsized test chamber housing 25 can keep the costs of the cooling unit 7 and the heating unit 8 low.

In addition, according to this embodiment, the assembly 30 is integrated with the circuit board 20, the connector chuck 40, and the test chamber housing 25. That is, because the circuit board 20 is already assembled in the test chamber housing 25 before the environmental test, doors need not be formed on the test chamber housing 25.

The structure of this embodiment, therefore, can prevent air outside of the test chamber housing 25 from being sucked thereinto due to the opening and closing of a door, making it possible to prevent dew from being formed on the surface of the circuit board 20.

While there has been described what is at present considered to be the embodiment and modifications of the invention, it will be understood that various modifications which are not described yet may be made therein, and it is intended to cover in the appended claims all such modifications as fall within the true spirit and scope of the invention.

This application is based upon and claims the benefit of priority of the prior Japanese Patent Application 2003-155455 filed on May 3, 2003 so that the contents of which are incorporated herein by reference.

What is claimed is:

1. An environmental test system for controlling a temperature environment of a member to be tested at least from a low temperature environment to a high temperature environment, said high temperature environment being higher in temperature than the low temperature environment, said system comprising:
   a test chamber unit having a wall portion for defining a test chamber that contains the member to be tested, said wall portion being made of heat insulating material, said temperature environment surrounding the member to be tested in the test chamber;
   a dehumidifier for eliminating moisture in the air to generate low dew point air, said low dew point air having a dew point temperature lower than a predetermined temperature defined by the low temperature environment;
   an air supplying unit for supplying the low dew point air to an inside of the test chamber; and
   a temperature changing unit for changing a temperature of the low dew point air supplied from the air supplying unit to the inside of the test chamber to control the temperature environment from the low temperature environment to the high temperature environment,
   wherein said temperature changing unit includes a cooling unit for cooling the low dew point air supplied from the air supplying unit up to substantially a predetermined cooling temperature, and a heating unit for heating the low dew point air supplied from the air supplying unit up to a substantially predetermined heating temperature, said predetermined heating temperature being defined by the high temperature environment,
   wherein said member to be tested includes a circuit board, further comprising:
   an energizing unit electrically connected to the circuit board and configured to energize the circuit board while the temperature environment is changed from the low temperature environment to the high temperature environment, and
   a supporting member fixedly supporting the circuit board, said supporting member having a first connector electrically mechanically connects between the energizing unit and the circuit board, and a first communication port communicable with the inside of the test chamber and the air supplying unit for circulating the low dew point air supplied therefrom in the test chamber,
   wherein said test chamber unit comprises a housing that is formed by the wall portion and defines the test chamber, said housing having an opening that allows the circuit board to be inserted therein, and, when the circuit board is inserted through the opening in the housing, said supporting member is closely contacted to an inner periphery of the opening of the housing so that the circuit board is substantially airtightly contained in the housing.

2. An environmental test system according to claim 1, wherein said circuit board is provided at its one peripheral end with a second connector, said wall portion of the housing has a wall to which the opening is formed, said wall being formed with a second communication port, and
   wherein said supporting member further comprises:
   a connector chuck member that removably holds the second connector of the circuit board, and
   a communication unit integrated with the first connector and the first communication port,
   when the circuit board held by the connector chuck member is inserted through the opening in the housing, said connector chuck member being closely fitted in the inner periphery of the opening of the housing, and said first communication port and said second communication port being closely contacted to be communicable with each other.

3. An environmental test system for controlling a temperature environment of a member to be tested at least from a low temperature environment to a high temperature environment, said high temperature environment being higher in temperature than the low temperature environment, said member to be tested including a circuit board, said system comprising:
   a test chamber unit having a wall portion for defining a test chamber that contains the member to be tested, said wall portion being made of heat insulating material, said temperature environment surrounding the member to be tested in the test chamber;
   an air supplying unit for supplying low dew point air to an inside of the test chamber, said low dew point air having a dew point temperature lower than a predetermined temperature defined by the low temperature environment; and
   a temperature changing unit for changing a temperature of the low dew point air supplied from the air supplying unit to the inside of the test chamber to control the temperature environment from the low temperature environment to the high temperature environment;
   an energizing unit electrically connected to the circuit board and configured to energize the circuit board while the temperature environment is changed from the low temperature environment to the high temperature environment, and
   a supporting member fixedly supporting the circuit board, said supporting member having a first connector electrically mechanically connecting between the energizing unit and the circuit board, and a first communication port communicable with the inside of the test chamber and the air supplying unit for circulating the low dew point air supplied therefrom in the test chamber,
   wherein said test chamber unit comprises a housing that is formed by the wall portion and defines the test chamber, said housing having an opening that allows the circuit board to be inserted therein, and, when the circuit board is inserted through the opening in the housing, said supporting member is closely contacted to an inner periphery of the opening of the housing so that the circuit board is substantially airtightly contained in the housing.

4. An environmental test system according to claim 3, wherein said temperature changing unit includes a cooling unit for cooling the low dew point air supplied from the air supplying unit up to substantially a predetermined cooling temperature, and a heating unit for heating the low dew point air supplied from the air supplying unit up to a substantially predetermined heating temperature, said predetermined heating temperature being defined by the high temperature environment.

5. An environmental test system according to claim 3, wherein said circuit board is provided at its one peripheral end with a second connector, said wall portion of the housing has a wall to which the opening is formed, said wall being formed with a second communication port, and
   wherein said supporting member further comprises:
   a connector chuck member that removably holds the second connector of the circuit board, and a communication unit integrated with the first connector and the first communication port, when the circuit board held by the connector chuck member is inserted through the opening in the housing, said connector chuck member being closely fitted in the inner periphery of the opening of the housing, and said first communication port and said second communication port being closely contacted to be communicable with each other.

* * * * *